(12) United States Patent
Honjo et al.

(10) Patent No.: US 6,610,632 B2
(45) Date of Patent: Aug. 26, 2003

(54) TAPE-FORMED OXIDE SUPERCONDUCTOR

(75) Inventors: Tetsuji Honjo, Tokyo (JP); Hiroshi Fuji, Tokyo (JP); Yuichi Nakamura, Tokyo (JP); Teruo Izumi, Tokyo (JP); Takeshi Araki, Tokyo (JP); Yutaka Yamada, Tokyo (JP); Izumi Hirabayashi, Tokyo (JP); Yuh Shiohara, Tokyo (JP); Yasuhiro Iijima, Tokyo (JP); Kaoru Takeda, Tokyo (JP)

(73) Assignees: International Superconductivity Technology Center, The Juridicial Foundation (JP); Showa Electric Wire & Cable Co., Ltd. (JP); Fujikura Ltd. (JP); Railway Technical Research Institute (JP); Kabushiki Kaisha Toshiba (JP)

( * ) Notice: Subject to any disclaimer, the term of this patent is extended or adjusted under 35 U.S.C. 154(b) by 0 days.

(21) Appl. No.: 09/974,972

(22) Filed: Oct. 12, 2001

(65) Prior Publication Data
US 2002/0076567 A1 Jun. 20, 2002

(30) Foreign Application Priority Data

Oct. 31, 2000 (JP) ........................................ 2000-333843
May 15, 2001 (JP) ........................................ 2001-145599

(51) Int. Cl.$^7$ ............................ B32B 1/00; H61B 12/00; H61F 6/00; H01L 39/00
(52) U.S. Cl. ........................ 505/237; 505/238; 505/239; 428/699; 428/701; 428/702
(58) Field of Search ................................. 428/469, 701, 428/702, 699; 505/100, 150, 230, 237, 238, 701, 239

(56) References Cited

U.S. PATENT DOCUMENTS

| | | | | |
|---|---|---|---|---|
| 5,432,151 A | * | 7/1995 | Russo et al. | 427/419.2 |
| 5,739,086 A | * | 4/1998 | Goyal et al. | 117/101 |
| 5,872,080 A | * | 2/1999 | Arendt et al. | 428/469 |
| 5,912,068 A | * | 6/1999 | Jia | 257/636 |
| 5,964,966 A | * | 10/1999 | Goyal et al. | 148/426 |
| 5,968,877 A | * | 10/1999 | Budai et al. | 117/86 |
| 5,972,847 A | * | 10/1999 | Feenstra et al. | 505/238 |
| 6,060,433 A | * | 5/2000 | Li et al. | 427/419.3 |
| 6,147,033 A | * | 11/2000 | Youm et al. | 118/712 |
| 6,150,034 A | * | 11/2000 | Paranthaman et al. | 428/469 |
| 6,270,908 B1 | * | 8/2001 | Williams et al. | 428/469 |
| 6,337,991 B1 | * | 1/2002 | Li et al. | 505/161 |
| 6,399,154 B1 | * | 6/2002 | Williams et al. | 427/327 |

* cited by examiner

Primary Examiner—Tom Dunn
Assistant Examiner—Colleen P. Cooke
(74) Attorney, Agent, or Firm—Lorusso, Loud & Kelly

(57) ABSTRACT

The present invention provides a tape-form oxide superconductor having a high degree of c-axis alignment and in-plane alignment and an improved Jc value. On a tape-form metal substrate which is non-magnetic or weakly magnetic and has high strength, there are sequentially formed a first intermediate layer wherein YSZ or $Zr_2Rx_2O_7$ particles are deposited from a target with ion irradiation from a direction inclined to the metal substrate, a second intermediate layer of $CeO_2$ or $Y_2O_3$ is formed and an $RE_{1+x}Ba_{2-x}Cu_3O_Y$ superconducting layer is formed by coating metalorganic salts containing F, followed by thermal decomposition.

21 Claims, 8 Drawing Sheets $\beta$ (deg.)

F I G. 5
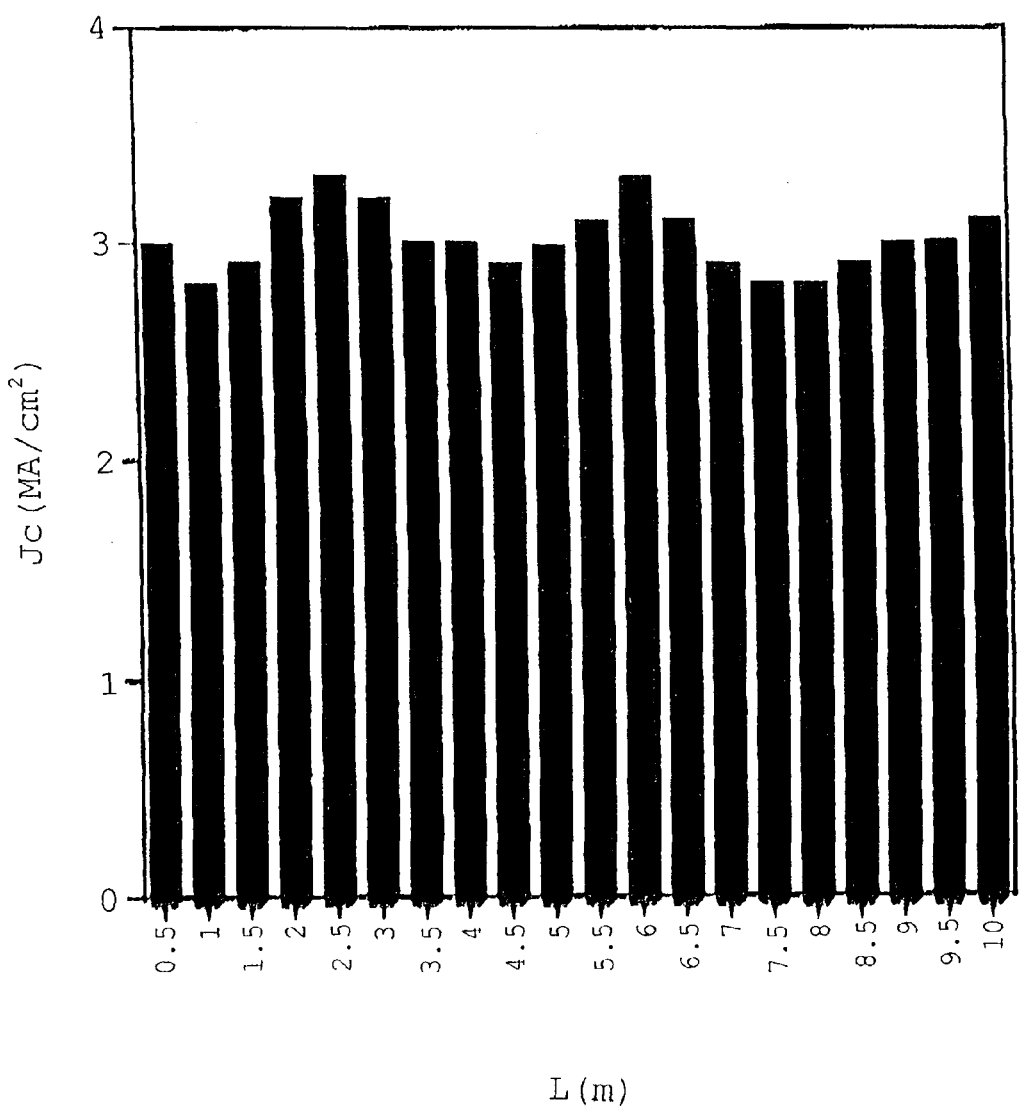

TAPE-FORMED OXIDE SUPERCONDUCTOR

BACKGROUND OF THE INVENTION

1. Field of the Invention

The present invention relates to a tape-form oxide superconductor and, more particularly, it relates to a tape-form oxide superconductor used for superconducting magnets, superconducting cables and electric power machines and instruments.

2. Description of the Related Art

Since the critical temperatures of oxide superconductors exceed the temperature of liquid nitrogen, they find application as superconducting magnets, superconducting cables and electric power machines and instruments.

In order to apply superconductors to the above fields, it is necessary to fabricate a wire having a high critical current density (Jc) and a long length. In order to obtain a long tape, it is necessary to form an oxide superconductor on a metal tape for mechanical strength and flexibility. Since oxide superconductors change their superconducting characteristics with changes in their crystalline alignment, it is necessary to improve in-plane alignment and it is therefore necessary to form an oxide superconductor on a tape-form, in-plane aligned substrate. In order to improve the critical current density, it is necessary that the c-axis of the oxide superconductor be aligned perpendicularly to the plane of the substrate and that its a-axis (or b-axis) have in-plane alignment almost parallel to the direction of current (hereinafter, referred to as "c-axis alignment" and "a-axis in-plane alignment", respectively) so as to keep the quantum connectivity of a good superconducting state.

When an oxide superconducting layer is formed on a tape substrate by means of sputtering, pulse laser vapor deposition (PLD), vapor deposition or chemical vapor deposition using metalorganic salts (MOCVD), the crystal alignment of the substrate is usually as random polycrystals and, therefore, the oxide superconductor formed on this substrate is affected by the substrate and is unable to have a high degree of alignment.

Therefore, a method of using biaxially textured Ni (100) substrates as the tape-form substrates has been investigated. In this method, a nickel substrate is cold rolled and then heated in vacuo to make a highly aligned product called RABiTS (trade mark Rolling-Assisted Biaxially Textured-Substrates). There has also been reported a method wherein cerium is deposited on the biaxially textured nickel substrate in an atmosphere of inert gas at high temperature by means of electron beam evaporation. Hydrogen is present during this deposition whereby a thin epitaxial layer of $CeO_2$ is formed, then a thick film of YSZ (yttria-stabilized zirconia) is formed thereon at high temperature in vacuo by sputtering and the resulting product is used as a substrate.

In the above method, a layer of YBCO (as used herein "YBCO" refers to the Y—Ba—Cu—O type) is formed by pulse laser vapor deposition on the above-described substrate (refer, for example, to John Emathis, et al., Jpn. J. Appl. Phys., Vol. 37 (1988), pages L1379–1382).

The $CeO_2$ layer on the biaxially textured Ni substrate is aligned so as to depress reaction of the Ni substrate with YSZ and to prevent oxidation of the Ni substrate which forms NiO islands on the nickel, while the YSZ layer is aligned so as to depress reaction with the superconducting layer. In other words, the YSZ layer functions as a buffer layer for preventing the diffusion of Ni, whereby reduction in the superconducting characteristic is prevented and the matching with the superconducting layer is maintained. With the biaxially textured Ni substrate, when the YSZ is directly deposited, Ni in the substrate reacts with Zr in the YSZ at their interface whereby no epitaxial growth takes place. When YSZ is directly aligned on the Ni substrate, the oxidation of the Ni substrate occurs whereby no epitaxial growth takes place. Accordingly, the YSZ is superimposed on the $CeO_2$ layer which does not react with the Ni substrate, whereby diffusion of the element constituting the substrate into the superconducting layer is prevented. Since $CeO_2$ is easily broken, a thick film of YSZ is formed on the thin film of $CeO_2$.

In the above method, YBCO is formed on YSZ having a good matching with YBCO but, since $CeO_2$ has a better crystallographic matching with YBCO than YSZ and further since $CeO_2$ is also better in terms of reactivity with an MOD solution, in one reported method a thin film of $CeO_2$ is further formed on the YSZ and a YBCO layer is formed thereon by MOD (metal organic deposition) to give a five-layered structure of biaxially textured Ni substrate/$CeO_2$/YSZ/$CeO_2$/YBCO (A. P. Malozemoff, et al., Eucas Conference, Sep. 14–17, 1999).

Metal organic deposition is a method where a metalorganic salt is applied and then thermally decomposed. Thus, a solution in which an organic compound having metal component is uniformly dissolved is applied on a substrate and heated for thermal decomposition whereupon a thin film is formed on the substrate. It does not require a vacuum and is able to achieve a high deposition rate at a low cost, whereby it is suitable for the manufacture of long tape oxide superconducting wires.

Since the MOD method uses a metalorganic salt as a starting material, it is also applicable to formation of an RE (123) superconductor, i.e. an $RE_{1+x}Ba_{2-x}Cu_3O_Y$ superconductor (as used herein, RE means Y, Nd, Sm, Gd, Eu, Yb or Ho) and to formation of an intermediate layer such as $CeO_2$. When organic salts are thermally decomposed, alkaline earth metal (such as Ba) carbonate is usually produced and, since a high-temperature thermal treatment of 800° C. or higher is necessary for the formation of an oxide superconductor by a solid state reaction of the carbonate, a method has been intensively used in recent years wherein an organic salt containing F (such as a TFA salt [trifluoroacetate]) is used as a starting material in a thermal treatment in a steam atmosphere, with control of steam partial pressure, whereupon an RE (123) superconductor is formed.

In that method where the TFA salt is used as a starting material, no nucleation results in a precursor and the RE (123) superconductor can be epitaxially grown on the substrate by the reaction of the steam with an amorphous precursor containing fluorine.

FIG. 8 shows a tape-form oxide superconductor 10 in a five-layered structure where $CeO_2$, YSZ, $CeO_2$ and RE (123) superconducting layers are sequentially formed by the MOD method on the above-mentioned biaxially textured Ni substrate. In the drawing, there is shown a structure where a first intermediate layer 12 comprising $CeO_2$, a second intermediate layer 13 comprising YSZ and a third intermediate layer 14 comprising $CeO_2$ are formed on the biaxially textured Ni substrate 11 and, on the third intermediate layer 14, an RE (123) superconducting layer 15 is formed by an MOD method using a TFA salt.

In the above-mentioned tape-form oxide superconductor 10 with a five-layered structure, the $CeO_2$ first intermediate layer, the YSZ second intermediate layer, the $CeO_2$ third intermediate layer and the superconducting layer are epitaxially grown on a biaxially textured Ni substrate and, in addition, reaction among the elements constituting the biaxially textured Ni substrate and the superconducting layer is depressed whereby it is possible to prevent loss of the superconducting characteristic. In principle, the foregoing is an excellent method for the manufacture of a tape-formed superconductor.

However, with regard to the biaxially textured Ni substrate used in this method, it is necessary that a cold rolled Ni substrate be subjected to a thermal treatment in vacuo to give a high degree of orientation and there is the disadvantage that, during the recrystallization by such a thermal treatment, grain growth will take place to the extent of forming grains as big as 100 $\mu$m or more and adversely influence the superconducting layer to the extent that the expected Jc value is not obtained.

Thus, at the (surface) grain boundary in the biaxially textured Ni substrate, disorder in the crystal structure occurs and, therefore, the intermediate layers and the superconducting layer formed on it are also affected, and such an influence becomes bigger especially when the growth directions of the adjacent crystal grains are greatly different.

Here the effect of the grain size on Jc of a long tape when the variation among the growth directions is constant will be considered. Jc of a tape material is determined at the area where Jc is lowest and, even if the variation in the growth directions is same, the result when the grain size is big is that numbers of grains aligned perpendicular to the direction of the current becomes small and the influence of the reduction in Jc value at grain boundaries having many growth directions on the Jc value as a whole becomes larger, whereby the Jc value is apt to become small. On the other hand, when the grain size is small, the numbers of the grains with a perpendicular alignment becomes large and the influence of grain boundaries on the Jc as a whole is nearly the same as that of the variation and does not cause a large reduction. Our studies obtained results wherein the larger the crystal size, the lower the Jc value.

In addition, since the biaxially textured Ni substrate is ferromagnetic and, further, its mechanical strength is low, when a superconducting magnet or superconducting cable is formed as a tape of an oxide superconductor, there is the problem that the influence of an external field increases to cause a reduction in the Jc value.

SUMMARY OF THE INVENTION

The present invention has as its objective, solution of the above-mentioned problems and, toward this end, provides a tape-form oxide superconductor having an excellent superconducting characteristic and being suitable for use as superconducting magnets and superconducting cable. The method of the present invention utilizes a metal substrate giving an improved quantum connectivity of the superconducting layer, i.e., improved Jc value due to high c-axis orientation and a-axis in-plane alignment, being non-magnetic or weakly magnetic and having high mechanical strength.

In order to achieve the above object, a tape-form oxide superconductor is produced by the present invention wherein:

on a tape-form metal substrate which is non-magnetic or only weakly magnetic and which has high strength, there are sequentially deposited:
an intermediate layer having a high degree of alignment, which functions to suppress diffusion of elements from the metal substrate into the superconducting layer and to suppress the reaction of the elements constituting the superconducting layer, the intermediate layer being formed by deposition of particles generated from a target onto the metal substrate with ion irradiation from a direction inclined with respect to the metal substrate; and
an oxide superconducting layer formed by applying a coating of metalorganic salts followed by thermal decomposition.

In another aspect of the present invention the above intermediate layer is formed as a two-layered structure. This tape-form oxide superconductor is produced as follows:

on a tape-form metal substrate which is non-magnetic or only weakly magnetic and which has high strength, there are sequentially deposited:
a first intermediate layer having a high degree of alignment, serving to suppress the diffusion of elements from the metal substrate into the superconducting layer and to suppress reactions of the elements constituting the superconducting layer formed by deposition of particles generated from a target onto a metal substrate, with ion irradiation from a direction inclined with respect to the metal substrate,
a second intermediate layer having a good matching with the oxide superconductor, and
an oxide superconducting layer formed by applying a coating of metalorganic salts followed by thermal decomposition.

According to the present invention, an intermediate layer is formed by deposition of particles generated form a target onto a substrate together with ion irradiation of the metal substrate and, therefore, it is possible to directly form a YSZ layer or film, etc. having good alignment on the substrate. The above-mentioned formation of NiO on the substrate is prevented and it is no longer necessary to coat the YSZ via a $CeO_2$ layer which does not react with the substrate.

BRIEF DESCRIPTION OF THE DRAWINGS

FIG. 5 is a graph showing the changes in the Jc value in the longitudinal direction of the tape-form oxide superconductor according to the present invention;

DESCRIPTION OF THE PREFERRED EMBODIMENTS

Figure 1:
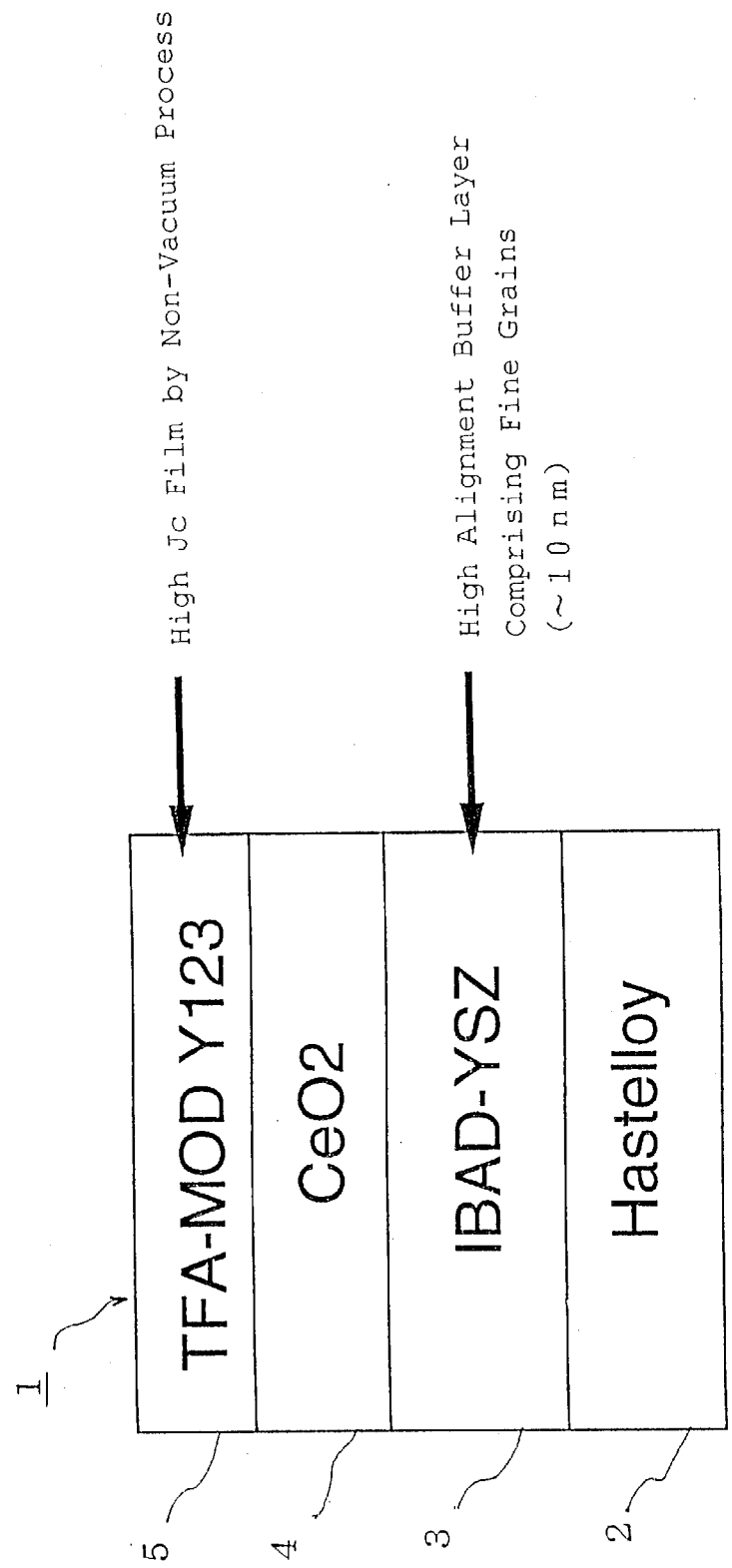
FIG. 1 is a cross sectional view of the tape-form oxide superconductor according to the present invention.

The substrate used in the present invention is a tape-form metal substrate which is non-magnetic or only weakly magnetic and has high strength. The substrate is usually non-textured and includes polycrystals having small crystal grains of around 10 nm such as rolled plate, e.g. Hastelloy which is known as a heat- and acid-stable alloy containing Mo, W, Cr, Fe, etc. as alloy elements besides Ni.

The intermediate layer on the substrate, i.e. the intermediate layer in the first embodiment of the present invention or the first intermediate layer in the second embodiment of the present invention, can be formed by deposition of the particles from a target onto the substrate together with ion irradiation in a direction inclined with respect to the substrate.

That method has been known as an IBAD method (ion beam assisted deposition).

When an oxide superconducting layer is formed on a substrate comprising polycrystals, it is usual that a superconducting layer having a good alignment is not obtained and there is also the problem that the substrate reacts with the elements which constitute the superconductor, whereupon the crystal structure of the superconductor disintegrates and the superconducting characteristic deteriorates. In order to avoid such a problem, it is necessary to form an intermediate layer between the substrate and the oxide superconducting layer.

To serve as such an intermediate layer, YSZ, MgO or $SrTiO_3$ have made into film by a common gas state reaction but, although the c-axis is aligned at a right angle to the substrate plane in the intermediate layer, the a-axis (or b-axis) does not have an in-plane alignment in nearly the same direction in the substrate plane and, therefore, the a-axis (or b-axis) of the oxide superconducting layer formed thereupon also lacks such an in-plane alignment and there is no improvement in Jc.

The IBAD method solves such a problem and, when the constituent particles from a target, by means of sputtering, are deposited on the substrate, the deposition is carried out by irradiation with both argon ions and oxygen ions generated by an ion gun from an inclined direction (e.g., 45°). According to that method, it is possible to form an intermediate layer having high degree of c-axis alignment and a-axis in-plane alignment to the film surface on the substrate (Japanese Patent Unexamined Publication Nos. 4-329867 and 4-331795). However, since the oxide superconducting layer coated on the intermediate layer is formed by pulse laser vapor deposition, there is the problem that cost is high whereby it is not suitable for the manufacture of a long wire.

The intermediate layer of the present invention comprises one or more components selected from $CeO_2$, $Y_2O_3$, YSZ and $Zr_2Rx_2O_7$ (wherein Rx is Y, Nd, Sm, Gd, Eu, Yb, Ho, Tm, Dy, Ce, La or Er.

When the intermediate layer is formed as a two-layered structure, it is preferred that YSZ or $Zr_2Rx_2O_7$ which is efficiently aligned by the IBAD method is used as the first intermediate layer while the second intermediate layer is formed of $CeO_2$ or $RE_2O_3$, both of which have a good matching with YBiCO.

In order to form the YBCO on the intermediate layer or on the second intermediate layer with good alignment, i.e. having a high degree of c-axis alignment and a-axis in-plane alignment, a MOD method is used wherein a metalorganic salt which is capable of a quick film-forming is applied, followed by subjecting to a thermal decomposition without the necessity of a vacuum.

The preferred metalorganic salt is a material comprising trifluoroacetate, octylate, naphthenate or acetate while the YBCO, is appropriately $RE_{1+x}Ba_{2-x}Cu_3O_Y$.

The oxide superconductor of the present invention can be formed by coating with a metalorganic salt followed by subjecting to a thermal decomposition. It is also possible to make the oxide superconducting layer in multi-layers, in which case a step of coating a mixed solution of metalorganic salt containing a predetermined molar ratio of metal elements constituting the oxide superconductor followed by calcining to form a superconductor precursor oxide is repeated so that plural layers of the oxide superconductor precursor are formed, and then subjected to a thermal treatment for crystallization.

In the formation of the above superconductor in a multi-layered structure, it is preferred that the calcination is carried out at the temperature of lower than 400° C., except for at least the outermost layer of the superconductor precursor oxide. This means that, in the formation of an oxide superconductor by crystallization of the calcined film in a three-layered structure, for example, the calcination of the first and the second layers is carried out at a temperature of lower than 400° C. and there is no problem if that of the third layer is carried out at a temperature lower or higher than 400° C.

In the above case, more preferably the calcination temperature is within a range of 250–350° C., except for at least the outermost layer of the superconductor precursor oxide layer.

Further, it is preferred that, during the crystallizing thermal treatment, partial pressure of vapor in the crystallizing thermal treatment atmosphere, prior to crystallization of the superconductor precursor oxide in at least at the outermost layer, be 4.0% by volume or less. In other words, when a calcined film in a three-layered structure is crystallized to form an oxide superconductor, the partial pressure of steam in the gaseous atmosphere of the crystallizing thermal treatment for the first and the second layers, until initiation of the crystallization of the third layer, is 4.0% by volume or less.

In the above case, it is preferred that the partial pressure of steam in the crystallizing thermal treatment atmosphere, before initiation of crystallization of the oxide superconductor precursor of at least the outermost layer, be within a range of 0.5–3.0% by volume. The gas in the crystallizing thermal treatment atmosphere is preferably a mixed gas comprising steam, oxygen and a gas which does not react with the oxide superconductor. The partial pressure of steam in the crystallizing thermal treatment atmosphere may be raised either with a certain gradient or in a step-by-step manner, provided that the above-mentioned condition is satisfied.

After completion of the crystallizing thermal treatment, it is preferred to introduce dry gas for depressing the loss of superconducting characteristics by the reaction of the steam with the superconductor.

In the case of formation of a long tape-form oxide superconductor, there is adopted a method where a delivering device and a winding device for the metal substrate tape are arranged inside a vacuum chamber and the substrate tape is continuously supplied from the delivering device for formation thereon of an intermediate layer at a heating holder by means of the above-described IBAD method, followed by winding by the winding device.

FIG. 1 shows the cross-sectional structure of the tape-form oxide superconductor 1 of the present invention wherein the intermediate layer is in a two-layered structure.

In the drawing, a Hastelloy comprising polycrystals which are non-magnetic or weakly magnetic and which have high strength is used as the metal substrate tape a and YSZ particles generated from a target are deposited on the substrate 2 together with ion irradiation from a direction inclined with respect to the substrate 2 to form the first intermediate layer 3. The first intermediate layer 3 has high c-axis and a-axis in-plane alignments to the substrate 2.

After that, the second intermediate layer 4 comprising $CeO_2$ having good matching with RE (123) is formed on the first intermediate layer 3 comprising YSZ and then an metalorganic salt containing F is coated on layer 4, followed by thermal decomposition to form a RE (123) film layer 5. Both the second intermediate layer 4 and the RE (123) layer 5 also have a high degree of c-axis and a-axis in-plane crystal orientation in accordance with the crystalline orientation of each of the underlying layers.

EXAMPLES

Example 1

On a Hastelloy tape having an average crystal particle size of about 10 nm and having a length of 10 m, a width of 10 mm and a thickness of 0.1 mm was coated a first intermediate layer of YSZ 1 $\mu$mm in thickness at room temperature, using an IBAD method and then a second intermediate layer of $CeO_2$ was formed thereon to a thickness of 0.5 $\mu$m by a sputtering method to prepare a compound substrate.

Subsequently, on the second intermediate layer was formed a YBCO layer having a thickness of 0.15 $\mu$m using a solution of a salt of trifluoroacetic acid (TFA) according to the following procedure.

First, M-TFA salts (M=Y, Ba, Cu) were mixed with a methanolic solution to a concentration of 0.25 mol/liter. The mixed solution was coated on the compound substrate by a roll coating method. After that, it was heated slowly up to 400° C. in an atmosphere containing steam to give an M-(O,F) precursor.

Then it was sintered at 725–800° C. for 1 hour in a low-oxygen atmosphere ($10^{-3}$ atm) containing steam and subjected to an oxygen annealing treatment at 450° C. for 1 hour.

Tc value, Jc value and in-plane alignment were measured for the tape-form oxide superconductor thus prepared.

Results of the measurements are shown in FIGS. 2–7.

Figure 2:
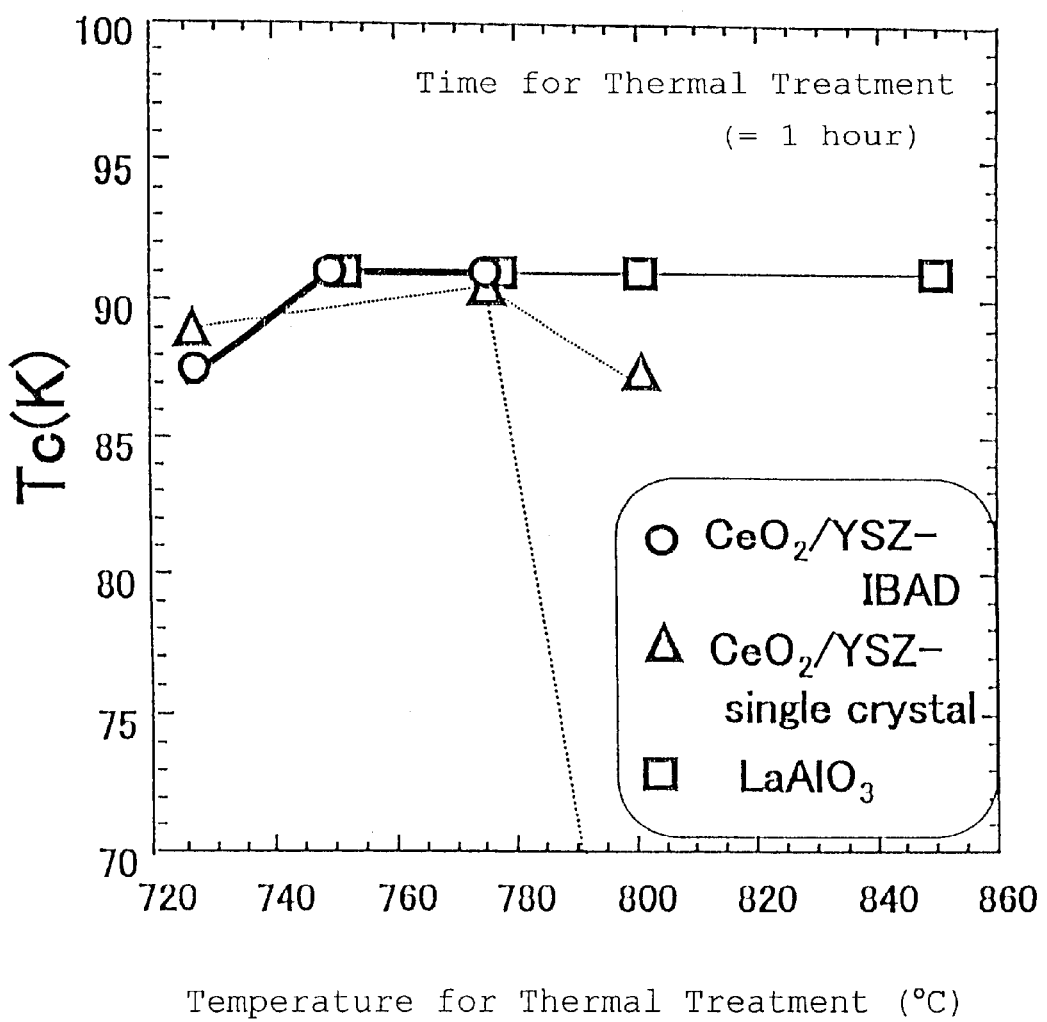
FIG. 2 is a graph showing an example and comparative examples of influence of the thermal treatment temperature on critical temperature (Tc) of the YBCO (123) layer of the tape-form oxide superconductor according to the present invention.

FIG. 2 shows influence of the thermal treatment temperature on the critical temperature (Tc) of the YBCO (123) layer and, at the same time, it is compared with the case where $CeO_2$ layer was coated on a YSZ single crystal or an $LaAlO_3$ single crystal.

The result was that, when the sintering time was 1 hour, unreacted $BaF_2$ remained at 725° C. while, at 800° C. or higher, formation of $BaCeO_3$ was noted. In the YBCO film formed at 750° C. and at 775° C., no other phase was noted by X-ray diffraction but the membrane was confirmed to have c-axis and a-axis alignment (in-plane alignment).

Figure 3:
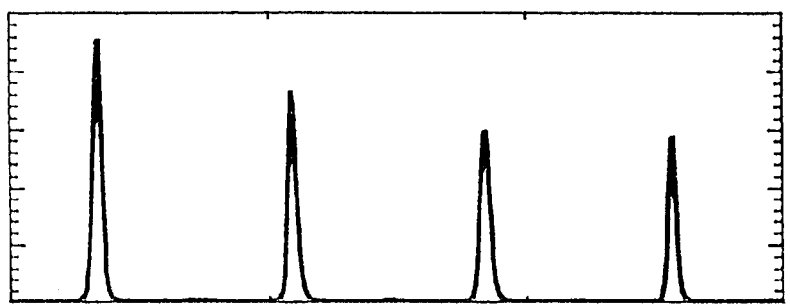
FIG. 3 is a graph showing an example of the full width of half maximum by X-ray diffraction of YSZ, $CeO_2$ and YBCO of the tape-form oxide superconductor according to the present invention.
Figure 3:
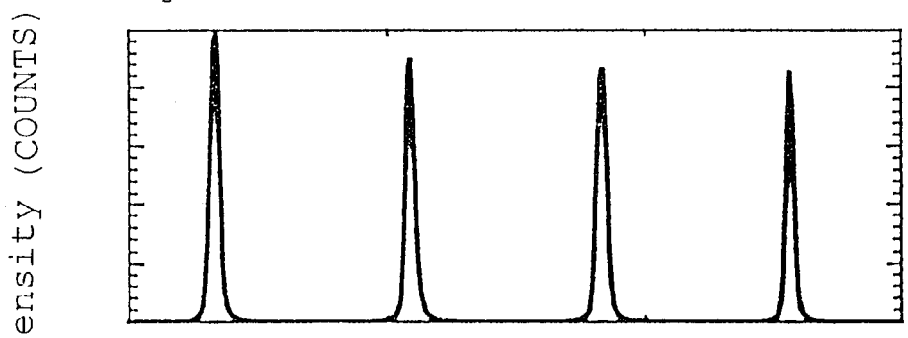
Figure 3:
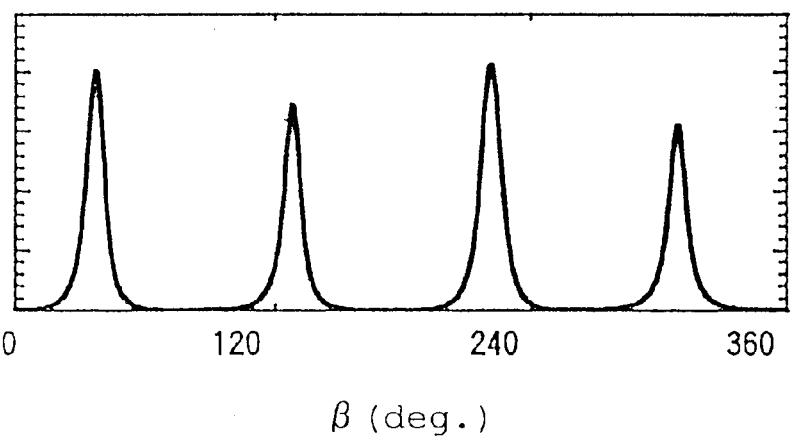

FIG. 3 shows the result of measurement of the full width of half maximum (FWHM) with the X-ray diffraction carried out in such a manner that X-rays were directed upon the (103) surface of the YBCO (123) layer at an angle of incidence of θ. A counter was placed at the position corresponding to an angle of 2θ to this incoming X-ray to measure the intensity of diffraction at a horizontal angle β to a vertical plane, including the incoming and diffracted X-rays.

The result was that the full width of half maximum of YSZ was found to be 8.8° while those of $CeO_2$ and YBCO film were 5.6° and 4.7°, respectively, showing an improvement in the alignment, i.e. a high degree of c-axis alignment and a-axis in-plane alignment.

Figure 4:
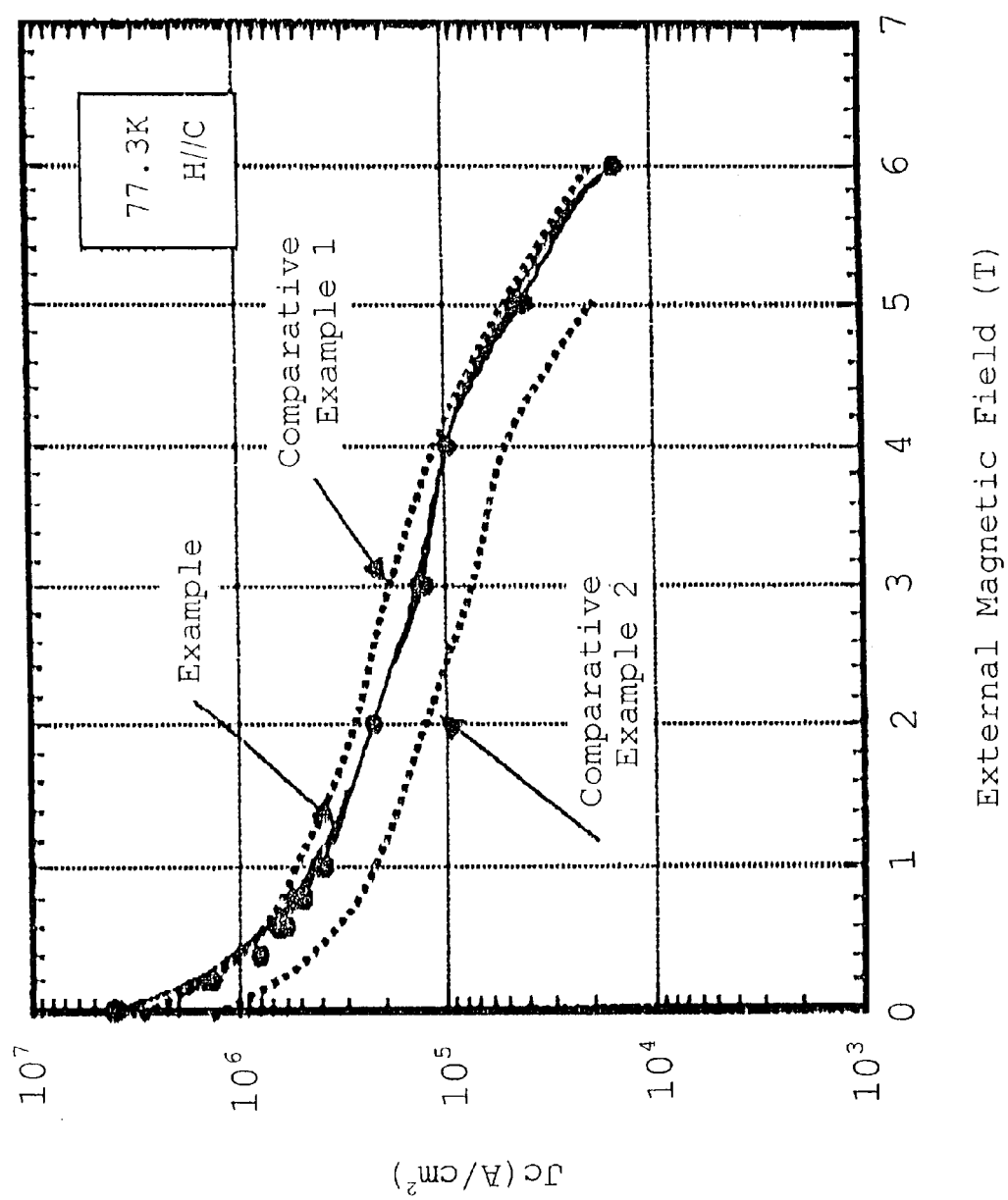
FIG. 4 is a graph of data for an example and Comparative Examples 1 and 2 showing dependency of Jc value of the tape-form oxide superconductor according to the present invention on external magnetic field.

FIG. 4 shows dependency of the Jc value, of samples cut to a length of 10 mm, on the external magnetic field. The Jc value was measured by a DC four-probe method at the voltage standard of 1 $\mu$V/cm.

It is apparent from the results that the above tape-form oxide superconductor has a good superconducting characteristic as compared with the case of Comparative Example 1 which will be described later wherein the first intermediate layer of YSZ is formed as a coating, by an IBAD method, on the Hastelloy tape and then a YBCO layer is formed by a laser vapor deposition method on the second intermediate layer of $Y_2O_3$. This improvement is presumably because of an improvement in the grain alignment since an MOD method is a process similar to that obtained with thermal equilibrium in a PLD method. In the case wherein a YBCO layer is formed by an MOD method on a compounded substrate prepared by coating $CeO_2$ and YSZ on a biaxially textured Ni substrate, (Comparative Example 2), the product has such high Jc values to the external magnetic field that, similar 77.3 K at 10 mm length, Jc>1 $MA/cm^2$ at 0 T and Jc>$10^5$ $A/cm^2$ at 2 T. FIG. 5 shows a Jc longitudinal distribution for a 10-meter tape. It is apparent from the results that a uniform Jc distribution is achieved at 1MA/$cm^2$ or more.

Comparative Example 1

A first intermediate layer of YSZ was formed in a thickness of 1 $\mu$m by an IBAD method on a Hastelloy tape having an average crystal particle size of about 10 nm and 10 m in length, 10 mm in width and 0.1 mm in thickness. Then a second intermediate layer of $Y_2O_3$ was formed to a thickness of 0.5 $\mu$m thereon by a laser vapor deposition whereby a compound substrate was prepared.

Subsequently, a YBCO layer having a thickness of 0.15 $\mu$m was formed on the second intermediate layer by laser vapor deposition.

Figure 6:
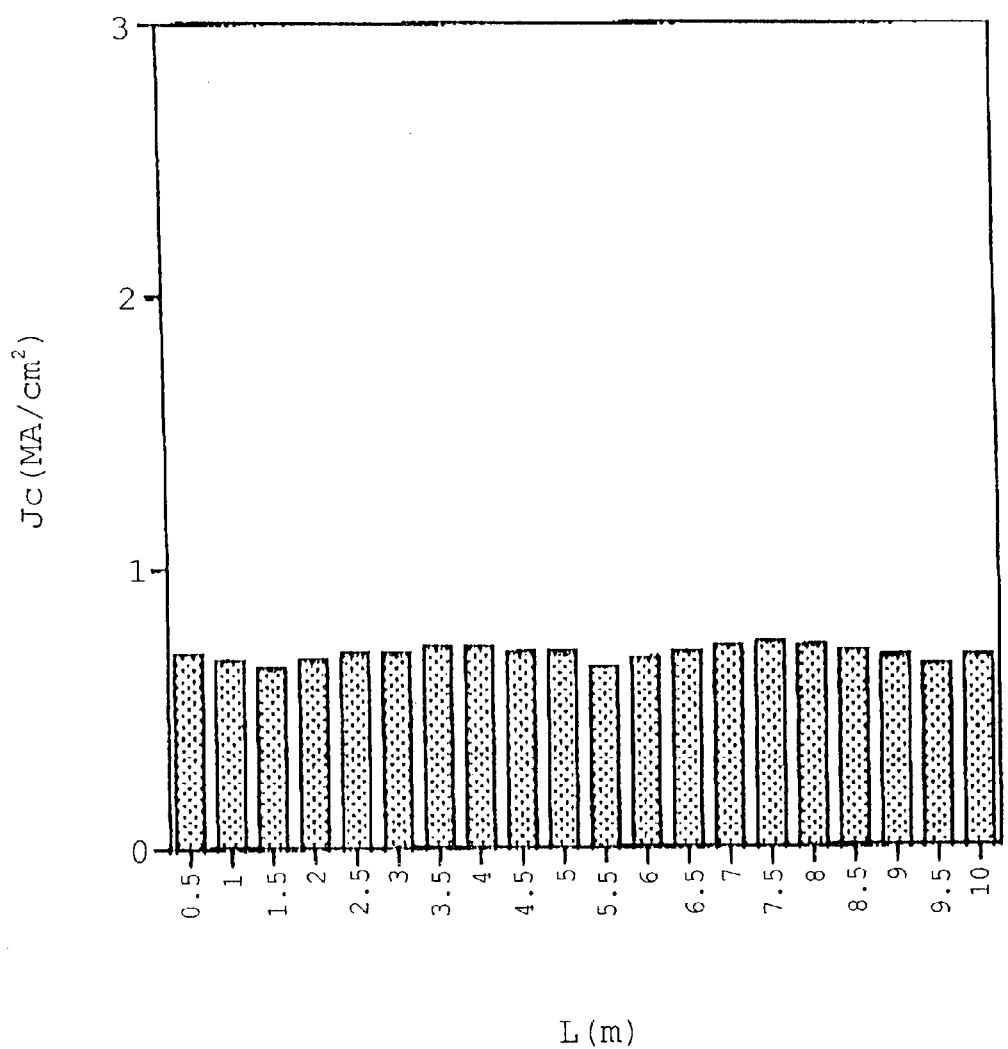
FIG. 6 is a graph showing the changes in the Jc value, in the longitudinal direction of the tape-form oxide superconductor in Comparative Example 1.

Dependency of the Jc values on the external magnetic field and the in-plane alignment of the tape-form oxide superconductor, thus prepared were measured and the results of these measurements are shown in FIGS. 4 and 6. The Jc values were measured by the same method as in the Example representative of the invention.

It is apparent from the results that, although the variation in the Jc values is small in the case of 10 mm, the Jc values were better in the Example representative of the invention.

Comparative Example 2

An epitaxial thin film of $CeO_2$ was formed with a thickness of 0.5 $\mu$m on a biaxially textured Ni substrate (RABiTS) having an average crystal particle size of about 50 $\mu$m or more and 10 mm in length, 10 mm in width and 0.1 mm in thickness and then a thick film of YSZ in a thickness of 1 $\mu$m was formed thereon at high temperature and in vacuo by a sputtering method whereupon a compound substrate was prepared.

A YBCO layer having a thickness of 0.15 pm was formed on the compound substrate in the same manner as in the Example, i.e. a TFA salt solution was used by an MOD method.

Figure 7:
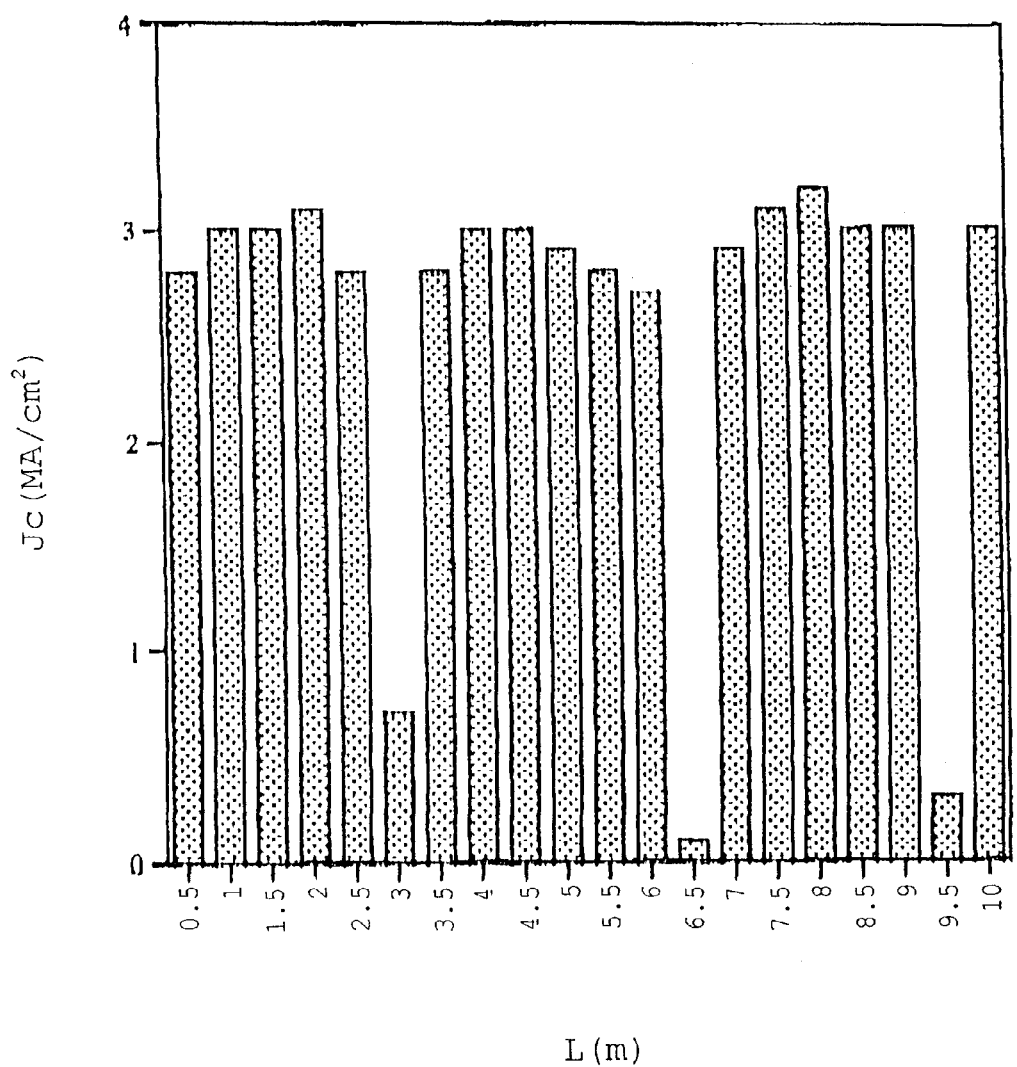
FIG. 7 is a graph showing the changes in the Jc value in the longitudinal direction of the tape-form oxide superconductor in Comparative Example 2.
Figure 8:
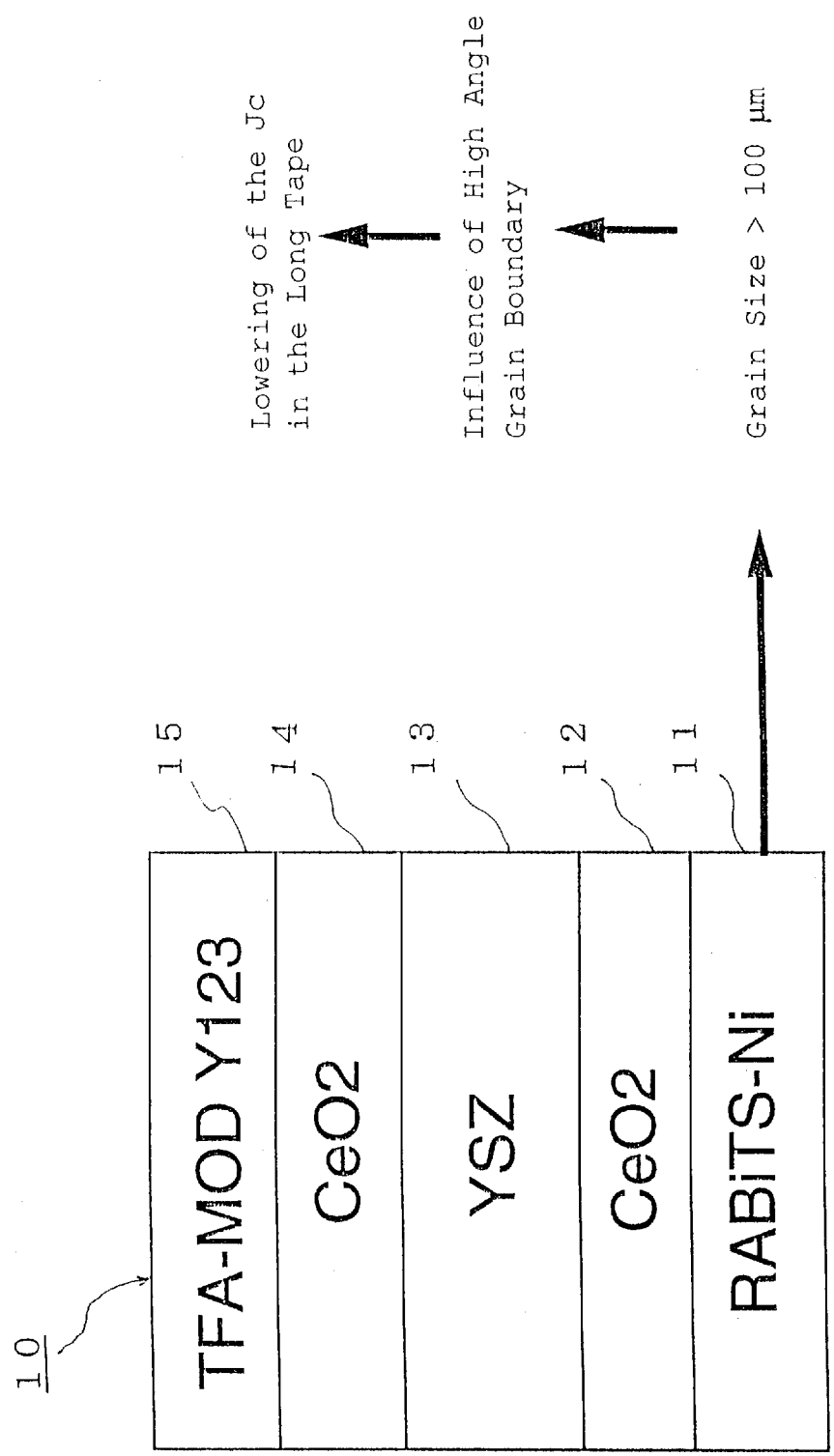
FIG. 8 is a cross-sectional view of the conventional oxide superconductor using a biaxially textured Ni substrate.

Results for the Jc values of the tape-form oxide superconductor thus prepared are shown in FIGS. 4 and 7.

It is apparent from the results that, in Comparative Example 2, although similar Jc values as in the Example of the invention are obtained in the case of a short sample, the Jc values in the case of a length of 10 m show low Jc value sites in several places and, since the total Jc value is dictated by such low Jc value sites, the total Jc value is small as compared with the Example representative of the invention.

Example 2

An IBAD compound substrate comprising Hastelloy/ YSZ/CeO$_2$ was used. This compound substrate was prepared by forming a first intermediate layer of YSZ in a thickness of 1 μm at room temperature by an IBAD method, on a Hastelloy tape having an average crystal size of about 10 nm and 10 mm in length, 10 mm in width and 0.1 mm in thickness and then forming a second intermediate layer of CeO$_2$ in a thickness of 0.5 μm by a sputtering method thereon.

TFA metal salts were dissolved in methanol with the molar ratio of Y:Ba:Cu set to 1:2:3 and the solution concentration was adjusted to 0.25 mol/liter on the basis of Y to prepare a coating solution.

The coating solution was coated on each substrate by a spin coating method to form a coated film. The coated film on the substrate thus prepared was heated at a slow rate up to 300° C. in an oxygen atmosphere containing steam and cooled down in the furnace and the coating solution was again coated on the substrate by the same method to form a coated film, heated at a slow rate up to 400° C. in an oxygen atmosphere containing steam and cooled down in the furnace to prepare a Y—Ba—Cu precursor in a two-layered structure.

In a crystallizing thermal treatment after the calcination treatment, the above precursor film was heated at a rate of 25° C./minute in a low-oxygen atmosphere of $10^{-3}$ atm containing steam, subjected to a crystallizing thermal treatment wherein the substrate temperature was kept at 750° C., and then held for 10 minutes in a furnace atmosphere switched to dry gas and then cooled down in the furnace.

Silver was vapor-deposited on the film prepared as above to form an electrode followed by subjecting to a thermal treatment in an oxygen atmosphere at 450° C. for 1 hour to form a superconducting film.

As a result of X-ray diffraction, the main ingredient of the superconducting film was confirmed to be YBCO.

The Tc value of the above superconducting film was measured by a DC four-probe method. Further, c-axis and a-axis alignments were measured by means of a YBCO (102) pole figure. Results of measurement of Tc values and c-axis and a-axis alignments are shown in Table 1.

Example 2 to form a coated film. The coated film on the substrate thus prepared was heated at a slow rate up to 400° C. in an oxygen atmosphere containing steam and then cooled down in the furnace to give a Y—Ba—Cu precursor. Then a solution was coated on this calcined film by the same method as above to form a coated film, heated at a slow rate up to 400° C. in an oxygen atmosphere containing steam and cooled down in the furnace to give a Y—Ba—Cu precursor. The Y—Ba—Cu precursor in a two-layered structure thus prepared was then made into a superconductor by the same method as in Example 2.

As a result of X-ray diffraction, YBCO was confirmed to be a main ingredient in all of the superconducting films.

Tc values and c-axis and a-axis alignments were measured for the above superconducting films in the same manner as in Example 2. The results are shown in Table 1.

As will be apparent from the above results for Example 2 and Comparative Example 3, when a comparison is made between the cases where the calcination treatment was carried out at 300° C. and at 400° C. in which the calcined films were formed in two layers, the Tc value increased and c-axis alignment was significantly improved when the calcination treatment for the first layer was carried out at 300° C. The reason this difference is believed to be the fact that epitaxial growth on the substrate was inhibited by the production of an impurity layer at the interface between the first and the second layers during the crystallizing thermal treatment. The main cause for the production of the impurity layer is believed to be due to the fact that, when the calcination treatment temperature was high, crystallization in the amorphous precursor film proceeded and, during the crystallizing thermal treatment, the calcined film and crystal grains thereof in the first and the second layers predominantly reacted whereupon the impurity was apt to be produced.

Example 3

Calcination was carried out at 300° C. in the same manner as in Example 2 except that the partial pressure of steam (1.05% by volume) in the crystallizing thermal treatment atmosphere and the time of the crystallizing thermal treatment were changed, then further calcination was carried out at 400° C. to form calcined films in two layers on the substrate and then a crystallizing thermal treatment was applied to form a superconducting film. As a result of X-ray analysis, YBCO was confirmed to be a main ingredient in the superconducting films.

Jc value and Ic value (voltage standard: 1 μV/cm) for the above superconducting film were measured by a DC four-probe method. Further, the peak integral intensity and the full width of half maximum corresponding to YBCO (005) plane were determined. The results are shown in Table 2.

TABLE 1

| Substrate | Example 2 IBAD Compounded Substrate | Comp. Ex. 3 IBAD Compounded Substrate |
|---|---|---|
| Number of Coatings | 2 | 2 |
| Film Thickness (μm) | 0.4 | 0.4 |
| Calcination Temp. (first run; ° C.) | 300 | 400 |
| Calcination Temp. (second run; ° C.) | 400 | 400 |
| c-Axis Alignment (%) | 74 | 40 |
| a-Axis Alignment (%) | 26 | 60 |
| Tc (K) | 92 | 84 |

Comparative Example 3

An IBAD compound substrate was used and a solution was coated on the substrate by the same method as in

TABLE 2

| Substrate | Example 3 IBAD Compounded Substrate | Comp. Ex. 4 IBAD Compounded Substrate |
|---|---|---|
| Partial Pressure of Steam (vol %) | 1.05 | 4.2 |
| Time for Thermal Treatment (min.) | 180 | 60 |
| Number of Coatings (times) | 2 | 2 |
| Film Thickness (ηm) | 0.4 | 0.4 |
| Jc (MC/cm$^2$) | 2.3 | 0.7 |
| Ic (A) | 90 | 28 |
| Peak Integral Intensity | 13693 | 7507 |
| Full Width of Half Maximum (deg.) | 0.60 | 1.10 |

Comparative Example 4

Calcination was carried out at 300° C. in the same manner as in Example 3 except that the partial pressure of steam (4.2% by volume) in the crystallizing thermal treatment atmosphere and the time for the crystallizing thermal treatment were changed, then further calcination was carried out at 400° C. to form calcined films in two layers on the substrate and then a crystallizing thermal treatment was applied to form a superconducting film. As a result of X-ray analysis, YBCO was confirmed to be a main ingredient in the superconducting films.

Jc value and Ic value, integral intensity and the full width of half maximum for each of the above superconducting films were measured in the same manner as in Example 3. The results are shown in Table 2.

It will be apparent from the above results for Example 3 and Comparative Example 4 that there were significant improvements in Jc and Ic values in the case where the films were formed in two layers and crystallizing thermal treatment was carried out by lowering the partial pressure of steam to 1.05% by volume, as compared with the case where crystallizing thermal treatment was carried out in a steam partial pressure of 4.2% by volume. It was confirmed from the locking curve at that time that, in the case of a crystallizing thermal treatment with a steam partial pressure of 4.2% by volume, the volume of textured c-axis crystals of YBCO was lower.

The reason therefor is believed to be due to the fact that, when the partial pressure of steam during the crystallizing thermal treatment increases, the growing speed of crystals of the YBCO film becomes high whereby crystallinity and the volume of textured c-axis crystals falls.

As will be apparent from the results of measurement for the above Examples and Comparative Examples, the tape-form oxide superconductor of the present invention is able to form an intermediate layer and an oxide superconducting layer on the intermediate layer whereby a high Jc value relative to the external magnetic field is obtained.

As mentioned hereinabove, the tape-form oxide superconductor according to the present invention has high c-axis and a-axis alignments (in-plane alignment) without deterioration of the superconducting characteristic at the crystal boundaries whereby, due to an excellent quantum connectivity at the crystal grain boundary, the superconducting characteristic can be improved.

Further, since a metal substrate which is non-magnetic or weakly magnetic and high mechanical strength is used, it is possible to provide a tape-form oxide superconductor suitable for use as a superconducting magnet and superconducting cable. Furthermore, since a superconducting layer is formed by an MOD method, which is a non-vacuum process, it is possible to produce a thick film by crystallization of plural layers of calcined film. Thus, the present invention is suitable for the manufacture of long wires and the manufacturing cost therefor can be significantly reduced.

What is claimed is:

1. A tape-form oxide superconductor comprising:
    (a) a tape-form metal substrate which is non-magnetic or weakly magnetic;
    (b) an intermediate layer having a high degree of alignment, and formed on said metal substrate for suppressing the diffusion of elements from the metal substrate into the superconducting layer and for suppressing reaction of the elements constituting the superconducting member, said intermediate layer being formed by deposition of particles from a target onto said metal substrate together with ion irradiation from a direction inclined to the metal substrate; and
    (c) an oxide superconducting layer formed by coating with said intermediate layer metalorganic salts followed by subjecting the coating to thermal decomposition.

2. A tape-form oxide superconductor according to claim 1 wherein said metal substrate is non-textured.

3. A tape-form oxide superconductor according to claim 2 wherein said metal substrate is polycrystalline and composed of crystal grains of about 10 nm.

4. A tape-form oxide superconductor according to claim 1 wherein the alignment of said intermediate layer is independent of crystallographic matching with said metal substrate.

5. The tape-form oxide superconductor according to claim 1, wherein the intermediate layer comprises at least one member selected from the group consisting of $CeO_2$, $Y_2O_3$, YSZ and $Zr_2Rx_2O_7$, wherein Rx is Y, Nd, Sm, Gd, Eu, Yb, Ho, Tm, Dy, Ce, La or Er.

6. The tape-form oxide superconductor according to claim 1, wherein the metalorganic salt comprises trifluoroacetate, octylate, naphthenate or acetate.

7. The tape-formed oxide superconductor according to claim 1, wherein the oxide superconducting layer comprises $RE_{1+x}Ba_{2-x}Cu_3O_Y$, wherein RE is at least one member selected from Y, Nd, Sm, Gd, Eu, Yb and Ho.

8. A tape-form oxide superconductor comprising:
    (a) a tape-form metal substrate which is non-magnetic or weakly-magnetic;
    (b) a first intermediate layer having a high degree of alignment, and formed on said metal substrate for suppressing the diffusion of elements from the metal substrate into the superconducting layer and for suppressing reaction of the elements constituting the superconducting member, said first intermediate layer being formed by deposition of particles from a target onto said metal substrate together with ion irradiation from a direction inclined to the metal substrate;
    (c) a second intermediate layer having a good matching with the oxide superconductor; and
    (d) an oxide superconducting layer formed by coating said second intermediate layer with metalorganic salts followed by subjecting the coating to a thermal decomposition.

9. A tape-form oxide superconductor according to claim 8 wherein said metal substrate is non-textured.

10. A tape-form oxide superconductor according to claim 9 wherein said metal substrate is polycrystalline and composed of crystal grains of about 10 nm.

11. A tape-form oxide superconductor according to claim 8 wherein the alignment of said first intermediate layer is independent of crystallographic matching with said metal substrate.

12. The tape-form oxide superconductor according to claim 8, wherein the metalorganic salt comprises trifluoroacetate, octylate, naphthenate or acetate.

13. The tape-formed oxide superconductor according to claim 8, wherein the oxide superconducting layer comprises $RE_{1+x}Ba_{2-x}Cu_3O_Y$, wherein RE is at least one member selected from Y, Nd, Sm, Gd, Eu, Yb and Ho.

14. The tape-form oxide superconductor according to claim 8, wherein the first intermediate layer comprises YSZ or $Zr_2Rx_2O_7$, wherein Rx is Y, Nd, Sm, Gd, Eu, Yb, Ho, Tm, Dy, Ce, La or Er.

15. The tape-formed oxide superconductor according to claim 8, wherein the second intermediate layer comprises $CeO_2$ or $Y_2O_3$.

16. A tape-form oxide superconductor comprising:
    (a) a tape-form metal substrate which is non-magnetic or weakly magnetic;
    (b) a first intermediate layer having a high degree of alignment and formed on said metal substrate for suppressing the diffusion of elements from the metal substrate into the superconducting layer and for suppressing reaction of the elements constituting the superconducting member, said intermediate layer being formed by deposition of YSZ or $Zr_2Rx_2O_7$ particles from a target onto said metal substrate together with ion irradiation from a direction inclined to the metal substrate, wherein Rx is Y, Nd, Sm, Gd, Eu, Yb, Ho, Tm, Dy, Ce, La or Er;

(c) a second intermediate layer comprising $CeO_2$ or $Y_2O_3$ having good matching with the oxide superconductor; and (d) a $RE_{1+x}Ba_{2-x}Cu_3O_Y$ superconducting layer formed by coating said second intermediate layer with metalorganic salts containing F followed by subjecting the coating to thermal decomposition.

17. The tape-form oxide superconductor according to claim 16, wherein the metalorganic salt comprises trifluoroacetate, octylate, naphthenate or acetate.

18. A tape-form oxide superconductor according to claim 16 wherein said metal substrate is non-textured.

19. A tape-form oxide superconductor according to claim 18 wherein said metal substrate is polycrystalline and composed of crystal grains of about 10 nm.

20. A tape-form oxide superconductor according to claim 1 wherein said metal substrate is Hastelloy.

21. A tape-form oxide superconductor according to claim 16 wherein the alignment of said intermediate layer is independent of crystallographic matching with said metal substrate.

* * * * *

UNITED STATES PATENT AND TRADEMARK OFFICE
CERTIFICATE OF CORRECTION

PATENT NO. : 6,610,632 B2
DATED : August 26, 2003
INVENTOR(S) : Honjo et al.

It is certified that error appears in the above-identified patent and that said Letters Patent is hereby corrected as shown below:

<u>Column 5,</u>
Line 62, "YBiCO" should read -- YBCO --.

Signed and Sealed this

Twenty-fifth Day of May, 2004

JON W. DUDAS
*Acting Director of the United States Patent and Trademark Office*